United States Patent [19]

Zahn et al.

[11] Patent Number: 4,774,171
[45] Date of Patent: Sep. 27, 1988

[54] BIS-1,2-NAPHTHOQUINONE-2-DIAZIDE-SULFONIC ACID AMIDES, THEIR USE IN A RADIATION-SENSITIVE MIXTURE, AND RADIATION-SENSITIVE COPYING MATERIAL

[75] Inventors: Wolfgang Zahn, Eltville-Erbach; Gerhard Buhr, Koenigstein, both of Fed. Rep. of Germany

[73] Assignee: Hoechst Aktiengesellschaft, Fed. Rep. of Germany

[21] Appl. No.: 10,640

[22] Filed: Feb. 4, 1987

[30] Foreign Application Priority Data

Feb. 6, 1986 [DE] Fed. Rep. of Germany ....... 3603578

[51] Int. Cl.⁴ .................. G03C 1/54; C07C 113/00
[52] U.S. Cl. ..................... 430/192; 430/165; 430/193; 534/556; 534/557; 534/561
[58] Field of Search ............ 430/192, 193, 165; 534/557, 556, 561

[56] References Cited

U.S. PATENT DOCUMENTS

| 3,046,110 | 7/1962 | Schmidt | 430/193 |
| 3,046,122 | 7/1962 | Sus | 534/557 |
| 3,046,123 | 7/1962 | Sus et al. | 430/193 |
| 3,687,663 | 8/1972 | Bloom | 534/557 |
| 4,397,937 | 8/1983 | Clecak et al. | 430/192 |
| 4,409,314 | 10/1983 | Buhr et al. | 430/192 |

FOREIGN PATENT DOCUMENTS

| 0085761 | 8/1983 | European Pat. Off. | |
| 0147596 | 7/1985 | European Pat. Off. | |
| 113289 | 7/1964 | U.S.S.R. | 534/557 |
| 706028 | 3/1954 | United Kingdom | 430/193 |

Primary Examiner—Charles L. Bowers, Jr.
Attorney, Agent, or Firm—Foley & Lardner, Schwartz, Jeffery, Schwaab, Mack, Blumenthal & Evans

[57] ABSTRACT

Novel bis-1,2-naphthoquinone-2-diazide-sulfonic acid amides of secondary diamines, which amides are represented by the formula

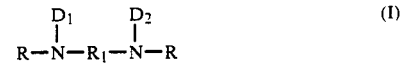

in which
R is a straight-chain or branched, unsubstituted or hydroxyl-substituted alkyl, cycloalkyl or aralkyl radical which has 1 to 14 carbon atoms and which includes a carbon chain that can be interrupted by either oxygen atoms, $R_1$ is an alkylene radical which has 2 to 12 carbon atoms and which includes a carbon chain that can be interrupted by ether oxygen atoms, or a mononuclear or polynuclear aralkylene radical which has 8 to 18 carbon atoms and which can, when it is a polynuclear radical, comprise aromatic members that are linked by a single bond, by —O—, —S—, —CO— or —$CR_2R_3$—, —N[$C_{1-3}$-alkyl]CO— or a $C_{2-5}$-alkyl group which can be interrupted by ether oxygen atoms, and $R_2$ and $R_3$ can be identical or different, and are separately hydrogen or an alkyl radical which is unsubstituted or substituted and which has 1 or 2 carbon atoms, or R and $R_1$ together form a cycloalkyl radical which has 4 to 16 carbon atoms and which can, when it is a polynuclear radical, comprise cycloaliphatic moieties that are linked by a carbon chain having 1 to 6 carbon atoms, and $D_1$ and $D_2$ are identical or different and are 1,2-naphthoquinone-2-diazide-4- or -5-sulfonyl radicals.

The compounds can be used as radiation-sensitive components in radiation-sensitive mixtures for copying materials, as they are characterized by good absorption in the range from 300 to 350 nm.

13 Claims, 3 Drawing Sheets

Table 1

$$\begin{array}{cc} O & O \\ \| & \| \\ R-N-R_1-N-R \end{array}$$

| Nr. | R | $R_1$ | D | $S_{calc.}$ | $S_{found}$ |
|---|---|---|---|---|---|
| 1 | $-CH_3$ | $-(CH_2)_2-$ | 1 | 11,61 | 11,2 |
| 2 | $-CH_3$ | $-(CH_2)_2-$ | 2 | 11,61 | 10,7 |
| 3 | $-CH_3$ | $-(CH_2)_6-$ | 1 | 10,54 | 10,6 |
| 4 | $-CH_3$ | $-(CH_2)_6-$ | 2 | 10,54 | 10,5 |
| 5 | $-CH_3$ | $-(CH_2)_{10}-$ | 1 | 9,65 | 9,5 |
| 6 | $-CH_3$ | $-(CH_2)_{10}-$ | 2 | 9,65 | 9,8 |
| 7 | $-CH_3$ | $-CH_2-CH_2-O-CH_2-CH_2-O-CH_2-CH_2-$ | 1 | 10,01 | 9,3 |
| 8 | $-CH_3$ | $-CH_2-CH_2-O-CH_2-CH_2-O-CH_2-CH_2-$ | 2 | 10,01 | 9,8 |
| 9 | $-CH_3$ | $-CH_2-CH_2-O-CH_2-CH_2-O-CH_2-CH_2-$ | 3 | 10,01 | 10,0 |
| 10 | $-CH_3$ | $-CH_2-C_6H_4-O-C_6H_4-CH_2-$ | 1 | 8,90 | 8,6 |
| 11 | $-CH_3$ | $-CH_2-C_6H_4-O-C_6H_4-CH_2-$ | 2 | 8,90 | 8,7 |
| 12 | $-CH_2-CH_2-CH_3$ | $-(CH_2)_{10}-$ | 1 | 8,90 | 9,0 |
| 13 | $-CH_2-CH_2-CH_3$ | $-(CH_2)_{10}-$ | 2 | 8,90 | 8,9 |
| 14 | $-CH_2-CH_2-CH_3$ | $-CH_2-CH_2-O-CH_2-CH_2-O-CH_2-CH_2-$ | 1 | 9,20 | 9,3 |
| 15 | $-CH_2-CH_2-CH_3$ | $-CH_2-CH_2-O-CH_2-CH_2-O-CH_2-CH_2-$ | 2 | 9,20 | 8,7 |
| 16 | $-CH_2-CH_2-CH_3$ | $-CH_2-C_6H_4-O-C_6H_4-CH_2-$ | 1 | 8,25 | 8,1 |
| 17 | $-CH_2-CH_2-CH_3$ | $-CH_2-C_6H_4-O-C_6H_4-CH_2-$ | 2 | 8,25 | 8,4 |
| 18 | $-CH_2-CH_2-CH_3$ | $-CH_2-C_6H_4-O-C_6H_4-CH_2-$ | 3 | 8,25 | 7,9 |
| 19 | $-CH(CH_3)_2$ | $-(CH_2)_{10}-$ | 1 | 8,90 | 9,0 |
| 20 | $-CH(CH_3)_2$ | $-(CH_2)_{10}-$ | 2 | 8,90 | 9,3 |
| 21 | $-CH(CH_3)_2$ | $-CH_2-CH_2-O-CH_2-CH_2-O-CH_2-CH_2-$ | 1 | 9,20 | 9,2 |
| 22 | $-CH(CH_3)_2$ | $-CH_2-CH_2-O-CH_2-CH_2-O-CH_2-CH_2-$ | 2 | 9,20 | 8,6 |

1) 1,2 naphthoquinone diazide (2) 5 sulfonyl
2) 1,2 naphthoquinone diazide (2) 4 sulfonyl
3) 1,2 naphthoquinone diazide (2) 4 sulfonyl and 5 sulfonyl Table 1 (contd.)

$$R-\underset{\underset{D}{|}}{N}-R_1-\underset{\underset{D}{|}}{N}-R$$

| Nr. | R | R₁ | D | Analysis [%] S calc. | S found |
|---|---|---|---|---|---|
| 23 | -CH(CH₃)₂ | -CH₂-C₆H₄-CH₂- | 1 | 9,36 | 9,2 |
| 24 | -CH(CH₃)₂ | -CH₂-C₆H₄-CH₂- | 2 | 9,36 | 9,3 |
| 25 | -CH(CH₃)₂ | -CH₂-C₆H₄-O-C₆H₄-CH₂- | 1 | 8,25 | 8,2 |
| 26 | -CH(CH₃)₂ | -CH₂-C₆H₄-O-C₆H₄-CH₂- | 2 | 8,25 | 8,1 |
| 27 | -CH(CH₃)₂ | -CH₂-C₆H₄-O-C₆H₄-CH₂- | 3 | 8,25 | 8,3 |
| 28 | -CH₂-CH(CH₃)₂ | -(CH₂)₁₀- | 1 | 8,56 | 8,5 |
| 29 | -CH₂-CH(CH₃)₂ | -(CH₂)₁₀- | 2 | 8,56 | 8,3 |
| 30 | -CH₂-CH(CH₃)₂ | -CH₂-C₆H₄-O-C₆H₄-CH₂- | 1 | 7,97 | 8,0 |
| 31 | -CH₂-CH(CH₃)₂ | -CH₂-C₆H₄-O-C₆H₄-CH₂- | 2 | 7,97 | 7,9 |
| 32 | -CH₂-(CH₂)₆-CH₃ | -CH₂-C₆H₄-O-C₆H₄-CH₂- | 1 | 6,99 | 6,5 |
| 33 | -CH₂-(CH₂)₆-CH₃ | -CH₂-C₆H₄-O-C₆H₄-CH₂- | 2 | 6,99 | 6,9 |
| 34 | (R-R together: cyclohexyl, -CH₂CH₂-CH₂CH₂- rings) | | 1 | 11,64 | 11,6 |
| 35 | (cyclohexyl) | | 2 | 11,64 | 11,4 |
| 36 | (dicyclohexyl-(CH₂)₃-, with -CH₂CH₂-CH₂CH₂- rings on each side, CH-(CH₂)₃-CH) | | 1 | 9,50 | 9,6 |
| 37 | (dicyclohexyl-(CH₂)₃-) | | 2 | 9,50 | 9,4 |

1) 1,2 naphthoquinone diazide (2) 5 sulfonyl
2) 1,2 naphthoquinone diazide (2) 4 sulfonyl
3) 1,2 naphthoquinone diazide (2) 4 sulfonyl and 5 sulfonyl Table 1 (contd.)

$$R-N(D)-R_1-N(D)-R$$

| Nr. | R | $R_1$ | D | $S_{calc.}$ | $S_{found}$ |
|---|---|---|---|---|---|
| 38 | (piperidine ring via CH₂-CH₂/CH₂-CH₂) | CH-(CH₂)₆-CH (linking two piperidine rings) | 1 | 8,95 | 9,0 |
| 39 | " | " | 2 | 8,95 | 8,9 |
| 40 | H₃C-O-CH₂-CH₂- | -CH₂-C₆H₄-O-C₆H₄-CH₂- | 1 | 7,93 | 7,6 |
| 41 | H₃C-O-CH₂-CH₂- | -CH₂-C₆H₄-O-C₆H₄-CH₂- | 2 | 7,93 | 7,9 |
| 42 | C₆H₅-CH₂-CH₂- | -CH₂-C₆H₄-O-C₆H₄-CH₂- | 1 | 7,12 | 7,1 |
| 43 | C₆H₅-CH₂-CH₂- | -CH₂-C₆H₄-O-C₆H₄-CH₂- | 2 | 7,12 | 7,0 |
| 44 | C₆H₅-CH₂-CH₂- | -CH₂-C₆H₄-O-C₆H₄-CH₂- | 3 | 7,12 | 6,3 |

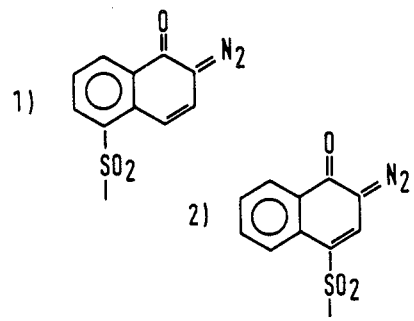

1) 1,2 naphthoquinone diazide (2) 5 sulfonyl
2) 1,2 naphthoquinone diazide (2) 4 sulfonyl
3) 1,2 naphthoquinone diazide (2) 4 sulfonyl and 5 sulfonyl

BIS-1,2-NAPHTHOQUINONE-2-DIAZIDE-SULFONIC ACID AMIDES, THEIR USE IN A RADIATION-SENSITIVE MIXTURE, AND RADIATION-SENSITIVE COPYING MATERIAL

BACKGROUND OF THE INVENTION

The present invention relates to novel bis-1,2-naphthoquinone-2-diazide-sulfonic acid amides of secondary diamines. The present invention also relates to the use of bis-1,2-naphthoquinone-2-diazide-sulfonic acid amides as radiation-sensitive components in a radiation-sensitive mixture, and to radiation-sensitive copying materials prepared from such a mixture.

A large number of derivatives, especially aromatic esters, of 1,2-naphthoquinone-2-diazide-sulfonic acids are already known to be useful as light-sensitive components in positive-working copying materials. A number of light-sensitive naphthoquinone-diazides are described by Jaromir Kosar in LIGHT-SENSITIVE SYSTEMS (John Wiley & Sons/New York, 1965), at pages 343–51.

The continuing trend toward miniaturization in the manufacture of electronic components requires the production of increasingly smaller structures. An important step in the manufacture of such components is the imagewise exposure and subsequent development of light-sensitive films that are applied to the material which is to be structured. The wavelength of the light used for exposure is a factor limiting the resolution capacity of light-sensitive layers, and structures having smaller dimensions can be produced with light of shorter wavelength. The conventionally used materials, however, show good light sensitivity only in the visible or near UV range (365–450 nm), whereas they display only inadequate light sensitivity in the shorter-wavelength range (300–350 nm). The naphthoquinone-diazide derivatives used heretofore have unsuitable absorption properties in the so-called mid-UV (300–350 nm), i.e., the materials are only slightly bleached by exposure at 313 nm.

The effect of substituents on the absorption properties in this range of napthoquinone-diazides has already been investigated (see Grant Willson et al., "Design of a positive resist for projection lithography in the mid-UV," presented at The Sixth International Technical Conference on Photopolymers, November 1982, Ellenville/USA); it has been found that naphthoquinonediazide-4- and -5-alkylsulfonates have favorable absorption properties in the range from 300 to 350 nm. The mercury vapor lamps conventionally used in exposure apparatus have, in the wavelength range from 300 to 350 nm, two emission lines at 313 and 334 nm, so that exposure of suitable materials in this wavelength range is possible.

The disadvantage of inadequate light sensitivity on exposure in the mid-UV has already been recognized, and attempts made to overcome it by the use of bis-1,2-napthoquinone-2-dizide-sulfonic acid esters of aliphatic diols, as described in European patent application No. 0 085 761 (corresponding to U.S. Pat. No. 4,397,937). But only a very limited number of tricyclic diols have been disclosed so far and, in addition, their preparation is possible only with the use of 4-dimethylamino-pyridine as a very expensive catalyst. The latter drawback also applied to the aliphatic esters of naphthoquinone-diazide-sulfonic acids, mentioned in European patent application No. 0 147 596, U.S. Pat. No. 4,417,810, 11-29-83, the preparation of which esters is possible only with the use of 4-dimethylaminopyridine or 4-(1-pyrrolidino)-pyridine.

The instability of arylsulfonic acid alkyl esters, which are used as alkylating agents, for example, in the preparation of ethers (compare Houben-Weyl, METHODEN DER ORGANISCHEN CHEMIE [Methods of Organic Chemistry], Volume IX (4th ed. 1955) at pages 674 et seq. (G. Thieme Verlag, Stuttgart), is generally known in the literature.

SUMMARY OF THE INVENTION

It is therefore an object of the present invention to provide stable, readily prepared 1,2-naphthoquinone-2-diazide-sulfonic acid derivatives which, as photoactive components, impart a higher light sensitivity than that of conventional mixtures to light-sensitive mixtures on exposure in the mid-UV range (300–350 nm).

It is also an object of the present invention to provide radiation-sensitive mixtures and copying materials that have a light-sensitivity which is at least comparable, if not better, in the visible or near-UV range to the light-sensitivity characterizing currently available materials.

In accomplishing the foregoing objects, there have been provided, in accordance with one aspect of the present invention, bis-1,2-naphthoquinone-2-diazide-sulfonic acid amides of secondary diamines, which acid amides are represented by the formula

in which

R is a straight-chain or branched, unsubstituted or hydroxyl-substituted alkyl, cycloalkyl or aralkyl radical which has 1 to 14 carbon atoms and which includes a carbon chain that can be interrupted by ether oxygen atoms, $R_1$ is an alkylene radical which has 2 to 12 carbon atoms and which includes a carbon chain that can be interrupted by either oxygen atoms, or a mononuclear or polynuclear aralkylene radical having 8 to 18 carbon atoms, when $R_1$ is a polynuclear aralkylene radical, the aromatic members comprising $R_1$ can be linked by a single bond, by —O—, —S—, —SO$_2$—, —CO—, —CR$_2$R$_3$—, -N[C$_{1-3}$-alkyl]CO- or a C$_{2-5}$-alkyl group which can be interrupted by ether oxygen atoms, $R_2$ and $R_3$ can be identical or different, and are separately hydrogen or an alkyl radical which is unsubstituted or substituted and which has 1 or 2 carbon atoms, or R and $R_1$ together form a cycloalkyl radical which has 4 to 16 carbon atoms and which is mononuclear or polynuclear, alternatively, a polynuclear cycloalkyl radical formed by R and $R_1$ can be comprised of cycloaliphatic moieties that are linked by a carbon chain having 1 to 6 carbon atoms, and $D_1$ and $D_2$ are identical or different and are 1,2-naphthoquinone-2-diazide-4- or -5-sulfonyl radicals.

In accordance with another aspect of the present invention, a radiation-sensitive mixture has been provided that comprises a bis-1,2-naphthoquinone-2-diazide-sulfonic acid amide as described above, which acid amide is present in an amount sufficient to impart radiation-sensitivity to the mixture. In one preferred embodiment, the radiation-sensitive mixture of the present invention further comprises a polymeric resinous binder which is insoluble in water and soluble or swellable in aqueous-alkaline solution.

There has also been provided, in accordance with another aspect of the present invention, a radiation-sensitive copying material comprised of the support and a radiation-sensitive layer provided on the support, which layer comprises (A) a polymeric resinous binder which is insoluble in water and soluble or swellable in aqueous-alkaline solutions and (B) a bis-1,2-napthoquinone-2-diazide-sulfonic acid amide as described above.

Other objects, features and advantages of the present invention will become apparent from the following detailed description. It should be understood, however, that the detailed description and specific examples, while indicating preferred embodiments of the invention, are given by way of illustration only, since various changes and modifications within the spirit and socpe of the invention will become apparent to those skilled in the art from this detailed description.

BRIEF DESCRIPTION OF DRAWINGS

The compounds of Formula (I) which describe a bis-1,2-naphthoquinone-2-diazide-sulfonic acid amide utilized in the Examples have specified R, $R_1$ and D groups and analysis set forth in Table 1 in the drawings.

DETAILED DESCRIPTION OF THE PREFERRED EMBODIMENTS

Those compounds of formula I are preferred in which

R is a straight-chain or branched, unsubstituted or hydroxyl-substituted alkyl or cycloalkyl radical that has 1 to 8, preferably 1 to 4 carbon atoms and a carbon chain which can be interrupted by ether oxygen atoms, or an aralkyl radical having 7 to 14 carbon atoms, $R_1$ is an alkylene radical that has 2 to 10 carbon atoms and a carbon chain which can be interrupted by 1 or 2 ether oxygen atoms, or an aralkylene radical which has 8 to 14 carbon atoms and which, in the case where $R_1$ is polynuclear, the aromatic members comprising the radical can be linked by a single bond, by —O—, —S—, —$SO_2$—, —CO— or —$CR_2R_3$—, —$N[C_{1-2}$-alkyl]CO— or a $C_{2-5}$-alkyl group which can be interrupted by ether oxygen atoms, and in which $R_2$ and $R_3$ are identical or different and are hydrogen or alkyl radicals, unsubstituted or substituted, having 1 or 2 carbon atoms, for example, alkyl radicals substituted by one or more fluorine atoms, or R and $R_1$ together form a cycloalkyl radical which has 4 to 16 carbon atoms and which is mononuclear or polynuclear where, in the latter case, the cycloaliphatic moieties comprising the radical can be linked by a carbon chain of 1 to 6 carbon atoms, and $D_1$ and $D_2$ are identical or different and are 1,2-naphthoquinone-2-diazide-4- or -5-sulfonyl radicals.

The naphthoquinone-diazide compounds according to the present invention can be used as the radiationsensitive component in radiation-sensitive mixtures. For such a use, 4- or 5-sulfonyl derivatives are preferably used as the radiation-sensitive component, either individually, as a mixture, or as mixed 4,5-sulfonyl derivatives. The use of a mixture of 4- and 5-sulfonyl derivatives is particularly preferred. Such mixtures, as well as the 4/5 mixed sulfonamides, show an advantageous, uniformly high absorption in the mid-UV range (300–350 nm), in which the two mercury vapor emission lines at 313 nm and 334 nm are located.

The compounds according to the present invention can be prepared by known processes, by reacting secondary diamines with reactive naphthoquinone-diazide-sulfonic acid derivatives, say the acid chloride. Because of the higher reactivity of the amines as compared with the alcohols, the preparation avoids the use of expensive catalysts and, hence is less expensive. Preferred processes are the reactions in inert solvents, such as ketones or chlorinated hydrocarbons, in the presence of inorganic or organic bases, such as sodium carbonate or tertiary amines such as triethylamine. However, the naphthoquinone-diazide-sulfonic acid amides according to the present invention can also be prepared under the conditions of phase transfer catalysis, for example, in a system comprised of a methylene chloride/aqueous solution of sodium carbonate or tetraalkylammonium hydroxide with a suitable catalyst, such as tetrabutylammonium bromide.

General instructions for the preparation of the naphthoquinone-diazide-sulfonic acid amides according to the invention are given below:

0.1 mol of secondary diamine is added dropwise with stirring to 0.2 mol of 1,2-naphthoquinone-2-diazide-sulfonic acid chloride and 0.22 mol of sodium carbonate or triethylamine in 400 ml of acetone, the temperature being kept below 25° C. by cooling. After the end of the dropwise addition, stirring is continued for 1 hour and (a) if the naphthoquinone-diazide-sulfonic acid amide has already precipitated, the latter is filtered off with suction, washed with cold acetone and then with water, and the filter residue is dried under reduced pressure or in a circulating-air drying oven at a moderately elevated temperature, or (b) if the bis-naphthoquinone-diazide-sulfonic acid amide is completely soluble in the reaction mixture, the batch is freed from inorganic constituents by filtration with suction. The filtrate is stirred into ten times the quantity of 4% aqueous hydrochloric acid, and the precipitated bis-sulfonic acid amide is filtered off, washed with water until free of acid and dried as in (a).

The 1,2-naphthoquinone-2-diazide-sulfonamides are thus obtained in good to very good yields, and frequently in almost quantitative yields. The compounds of the present invention prepared in this way are obtained in such purity that further purification is unnecessary before use in a radiation-sensitive mixture. The purity is frequently so good that the values determined experimentally by combustion analysis correspond to the calculated values. In some cases, however, recrystallization or reprecipitation in suitable solvents or solvent mixtures is advantageous.

The radiation-sensitive mixtures according to the present invention, prepared with the use of the compounds of the present invention, are distinguished in practice by a high light sensitivity, which is generally superior to conventional systems in the visible or near-UV range, and is markedly better than that of the hitherto known systems in the mid-UV range. The radiation-sensitive mixtures formulated with the naphthoquinone-diazide compounds according to the present invention also show good sensitivities to high-energy radiation, for example, electron beams and X-rays, and give good lithographic results. Very good contrast values are also achieved with the radiation-sensitive layers of the present invention.

The high light sensitivity of mixtures within the present invention is an essential factor in the production of microelectronic circuits or components, especially in the so-called "in-line" processing of wafers, where the throughput of the wafers is determined by the most time-consuming process step. A critical point in such processing is the exposure time, i.e., the throughput in the exposure apparatus. Particularly in the case of monochromatic irradiation or exposure with shorter-wavelength actinic light, this usually led to unsatisfactory cycle times in the past and, hence, to inadequate throughput of wafers, which finally entailed an unacceptably slow production rate.

The concentration of naphthoquinone-diazide-sulfonic acid amides of the present invention in a raidation-sensitive mixture can fluctuate within relatively wide limits. In general, the proportion is about 4% to 40%, preferably between 6% and 25%, relative to the weight of the solids content of the mixture.

The light-sensitive mixtures of the present invention can also contain a polymeric, water-insoluble resinous binder which dissolves in solvents used for the mixture according to the present invention and which is soluble, or at least swellable, in aqueous alkalis.

The novolak condensation resins used in many positive ·copying materials based on naphthoquinonediazides have also proved particularly useful and advantageous as an addition to mixtures of the present invention containing the above-described novel naphthoquinone-diazide-sulfonic acid amides. The nature and quantity of the novolak resins can differ depending on the application. Novolak proportions in total solids of between 60% and 96%, and particularly 75% and 95%, are preferred. For special requirements like adhesion, surface smoothness, special absorption properties, etc., a light-sensitive mixture within the present invention can also contain small quantities of substances such as wetting agents, adhesion promoters and dyes.

Other suitable binders are polymeric binders with phenolic hydroxyl groups in side chains, such as vinylphenols or esters and amides of acrylic acid and methacrylic acid with, for example, hydroquinone, pyrocatechol, resorcinol, pyrogallol or hydroxyphenylamine. In addition to homopolymers, copolymers of the aforesaid monomers with one another or with other polymerizable monomers, such as styrene, methyl methacrylate, methyl acrylate, biphenylol methacrylate and biphenylol acrylate, can also be used as binders in mixtures of the present invention. Mixtures of the polymers with novolaks can also be used. The nature and quantity of the binders can differ depending on the application, but largely corresponds to the ranges given for novolak.

For coating a suitable support for the preparation of the copying material according to the present invention, the mixtures are generally dissolved in a solvent. The selection of the solvents must be matched to the intended coating process, the layer thickness and the drying conditions. Suitable solvents for a mixture of the present invention are ketones, such as methyl ethyl ketone, and N-methyl-pyrrolidone; alcohol ethers such as ethylene glycol monoethyl ether and propylene glycol monoethyl ether; alcohol ether-acetates like ethylene glycol monoethyl ether-acetate and propylene glycol monoethyl ether-acetate; and esters such as butyl acetate. Mixtures of solvents can also be used that can, inter alia, also contain xylene. In principle, all solvents can be used which do not irreversibly react with the layer components.

The compunds of the present invention can be used as the radiation-sensitive component in copying materials for the microelectronics industry such as photoresists. The preferred supports are silicon wafers, which can also have been superficially oxidized. The layers which arise during conventional microelectronic fabrication processes, such as layers comprised of silicon nitride, polysilicon, silicon oxide, polyimides or metals such as aluminum and silicon implanted with suitable doping materials, are likewise suitable as supports for the mixtures according to the invention. Wafers of GaAs alloys also represent suitable supports. Moreover, the compunds according to the present invention can be used in admixture with binders in the production of printed circuit boards, the supports typically employed for this purpose being used. Other suitable supports are aluminum plates that have undergone an appropriate pretreatment and are suitable for the production of printing plates.

Coating of the supports conventionally used in the microelectronics industry is carried out in a known manner, as by spin-coating. Other coating techniques, such as spraying, roller coating, dipping, use of slot dies, blades and application by casting can also be used for these and other supports.

Conventional light sources are used for exposure, and exposure apparatus can be used with particular advantage when it incorporates an optical system that is permeable only for actinic light in the mid-UV range.

Suitable aqueous-alkaline solutions, which are used for developing and which can also contain minor amounts of wetting agent, remove those areas of the light-sensitive layer that have been struck by light and, thus, generate a positive image of the original.

The radiation-sensitive mixtures according to the present invention are preferably used in lithographic processes for the production of integrated circuits and discrete electrical components. They are used in this regard as a masking material for various process steps, including etching of the support, implantation of ions into the support, and deposition of materails on the support.

For a comparison of the light sensitivities, the photoresist formulation, i.e., the weight ratio of radiation-sensitive component to binder, and the developer were selected such that, during the developing step, the mixtures according to the present invention always had approximately the same dark erosion as the comparison resist which was developed in the developer conventionally employed with the latter material. The dark erosion describes the decrease in layer thickness of a light-sensitive layer, which is caused by the solubility, in most cases.slight, of even unexposed layer areas in the developer during the developing step. The comparison was always carried out at the same layer thicknesses. The layer thickness was adjusted by choosing a suitable solids content.

After filtration, the radiation-sensitive mixtures were applied to suitable supports, such as silicon wafers, by spin-coating. Adjustment of the speed of rotation of the spin coater permitted accurate adjustment of the layer thickness of the photoresists. The layers were dried for 30 minutes at 90° C. in a circulating-air drying cabinet. After the drying process, the layer thicknesses of the photoresists used for the light sensitivity comparison were 1.0 $\mu$m.

Of course, lower and higher layer thicknesses can also be produced with the mixtures according to the present invention, and the ratio of radiation-sensitive component to the binder and the total solids content must then be adapted according to the application, in order to obtain the best lithographic results.

The light sensitivity comparisons were carried out by exposure with radiation in the conventional wavelengths (365–436 nm) and in mid-UV range (300–350 nm). Contact exposure apparatus from Messrs. Suess GmbH & Co. was used. The exposure power was measured by an Optical Associates model 205 UV Powermeter which was fitted with sensors suitable for the exposure wavelength ranges. Mercury vapor lamps and a suitable optical system for separating out certain wavelength ranges were installed in the exposure apparatus. The photoresists were exposed at constant exposure power for different times and then developed in a suitable developer, the developing times being of the same length. Suitable developers are aqueous-alkaline solutions which are free of metal ions but which can also contain metal ions such as sodium and/or potassium ions. The developer solutions can be buffered, for example with silicate, borate or phosphate solutions or suitable mixtures of salt solutions, and they can also contain small amounts of surfactants.

The measure of light sensitivity used was the value of the exposure energy density that was necessary for dissolving away 0.5 μm of the radiation-sensitive layer during the developing step. The layer thicknesses were measured by the layer thickness measuring instruments Sloan Dektak I or Dektak II or Rudolph FTM.

Under the conditions described above, the radiation-sensitive mixtures according to the present invention show, on exposure in the visible or near UV range, a light sensitivity that is at least comparable with the conventional photoresists and in most cases better and, on exposure in the mid-UV range, show a markedly increased light sensitivity which is about twice that of a conventional photoresist.

Examples of the bis-1,2-naphthoquinone-2-diazide-sulfonic acid amides, and of the light-sensitive mixtures, according to the present invention, are given below. It should be understood, however, that the scope of the present invention is not restricted to these illustrations.

EXAMPLES 1–44 [SEE TABLE I]

TABLE 1

$$\begin{matrix} & D & & D & \\ & | & & | & \\ R-\!\!&N\!\!-\!\!&R_1\!\!-\!\!&N\!\!-\!\!&R \end{matrix}$$

| Nr. | R | $R_1$ | D | $S_{calc.}$ | $S_{found}$ |
|---|---|---|---|---|---|
| 1 | —CH₃ | —(CH₂)₂— | 1 | 11,61 | 11,2 |
| 2. | —CH₃ | —(CH₂)₂— | 2 | 11,61 | 10,7 |
| 3 | —CH₃ | —(CH₂)₆— | 1 | 10,54 | 10,6 |
| 4 | —CH₃ | —(CH₂)₆— | 2 | 10,54 | 10,5 |
| 5 | —CH₃ | —(CH₂)₁₀— | 1 | 9,65 | 9,5 |
| 6 | —CH₃ | —(CH₂)₁₀— | 2 | 9,65 | 9,8 |
| 7 | —CH₃ | —CH₂—CH₂—O—CH₂—CH₂—O—CH₂—CH₂— | 1 | 10,01 | 9,3 |
| 8 | —CH₃ | —CH₂—CH₂—O—CH₂—CH₂—O—CH₂—CH₂— | 2 | 10,01 | 9,8 |
| 9 | —CH₃ | —CH₂—CH₂—O—CH₂—CH₂—O—CH₂—CH₂— | 3 | 10,01 | 10,0 |
| 10 | —CH₃ | 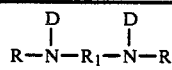 | 1 | 8,90 | 8,6 |
| 11 | —CH₃ | 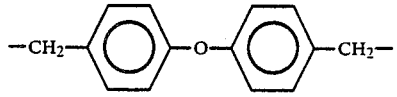 | 2 | 8,90 | 8,7 |
| 12 | —CH₂—CH₂—CH₃ | —(CH₂)₁₀— | 1 | 8,90 | 9,0 |
| 13 | —CH₂—CH₂—CH₃ | —(CH₂)₁₀— | 2 | 8,90 | 8,9 |
| 14 | —CH₂—CH₂—CH₃ | —CH₂—CH₂—O—CH₂—CH₂—O—CH₂—CH₂— | 1 | 9,20 | 9,3 |
| 15 | —CH₂—CH₂—CH₃ | —CH₂—CH₂—O—CH₂—CH₂—O—CH₂—CH₂— | 2 | 9,20 | 8,7 |
| 16 | —CH₂—CH₂—CH₃ | 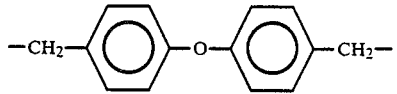 | 1 | 8,25 | 8,1 |
| 17 | —CH₂—CH₂—CH₃ | 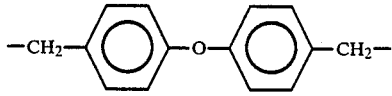 | 2 | 8,25 | 8,4 |
| 18 | —CH₂—CH₂—CH₃ | 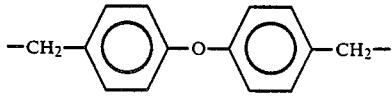 | 3 | 8,25 | 7,9 |
| 19 | —CH(CH₃)₂ | —(CH₂)₁₀— | 1 | 8,90 | 9,0 |

TABLE 1-continued $$\begin{array}{cc} D & D \\ | & | \\ R-N-R_1-N-R \end{array}$$

| Nr. | R | $R_1$ | D | $S_{calc.}$ | $S_{found}$ |
|---|---|---|---|---|---|
| 20 | —CH(CH₃)₂ | —(CH₂)₁₀— | 2 | 8,90 | 9,3 |
| 21 | —CH(CH₃)₂ | —CH₂—CH₂—O—CH₂—CH₂—O—CH₂—CH₂— | 1 | 9,20 | 9,2 |
| 22 | —CH(CH₃)₂ | —CH₂—CH₂—O—CH₂—CH₂—O—CH₂—CH₂— | 2 | 9,20 | 8,6 |
| 23 | —CH(CH₃)₂ | —CH₂—C₆H₄—CH₂— | 1 | 9,36 | 9,2 |
| 24 | —CH(CH₃)₂ | —CH₂—C₆H₄—CH₂— | 2 | 9,36 | 9,3 |
| 25 | —CH(CH₃)₂ | —CH₂—C₆H₄—O—C₆H₄—CH₂— | 1 | 8,25 | 8,2 |
| 26 | —CH(CH₃)₂ | —CH₂—C₆H₄—O—C₆H₄—CH₂— | 2 | 8,25 | 8,1 |
| 27 | —CH(CH₃)₂ | —CH₂—C₆H₄—O—C₆H₄—CH₂— | 3 | 8,25 | 8,3 |
| 28 | —CH₂—CH(CH₃)₂ | —(CH₂)₁₀— | 1 | 8,56 | 8,5 |
| 29 | —CH₂—CH(CH₃)₂ | —(CH₂)₁₀— | 2 | 8,56 | 8,3 |
| 30 | —CH₂—CH(CH₃)₂ | —CH₂—C₆H₄—O—C₆H₄—CH₂— | 1 | 7,97 | 8,0 |
| 31 | —CH₂—CH(CH₃)₂ | —CH₂—C₆H₄—O—C₆H₄—CH₂— | 2 | 7,97 | 7,9 |
| 32 | —CH₂—(CH₂)₆—CH₃ | —CH₂—C₆H₄—O—C₆H₄—CH₂— | 1 | 6,99 | 6,5 |
| 33 | —CH₂—(CH₂)₆—CH₃ | —CH₂—C₆H₄—O—C₆H₄—CH₂— | 2 | 6,99 | 6,9 |
| 34 | | cyclohexyl (R and part of ring) | 1 | 11,64 | 11,6 |
| 35 | | cyclohexyl (R and part of ring) | 2 | 11,64 | 11,4 |
| 36 | dicyclohexyl—(CH₂)₃— bridge | | 1 | 9,50 | 9,6 |
| 37 | dicyclohexyl—(CH₂)₃— bridge | | 2 | 9,50 | 9,4 |

TABLE 1-continued $$R-\overset{D}{\underset{|}{N}}-R_1-\overset{D}{\underset{|}{N}}-R$$

| Nr. | R | R₁ | D | Analysis [%] $S_{calc.}$ | $S_{found}$ |
|---|---|---|---|---|---|
| 38 | 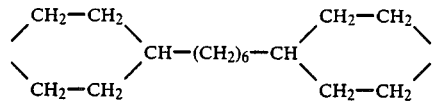 | | 1 | 8,95 | 9,0 |
| 39 | | | 2 | 8,95 | 8,9 |
| 40 | H₃C—O—CH₂—CH₂— | 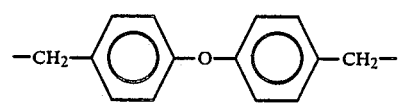 | 1 | 7,93 | 7,6 |
| 41 | H₃C—O—CH₂—CH₂— | 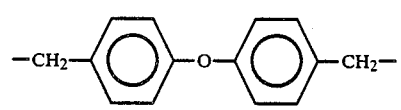 | 2 | 7,93 | 7,9 |
| 42 | 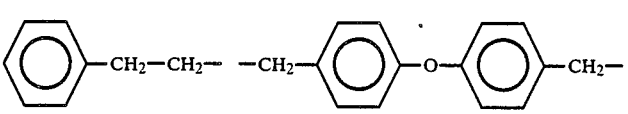 | 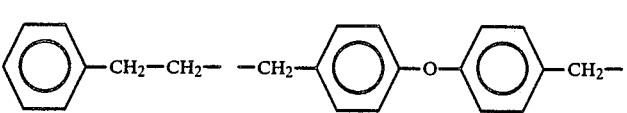 | 1 | 7,12 | 7,1 |
| 43 | 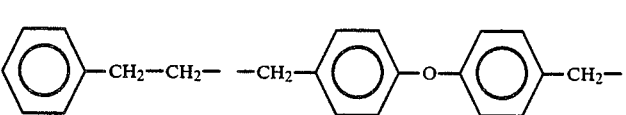 | | 2 | 7,12 | 7,0 |
| 44 | 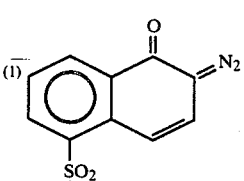 | | 3 | 7,12 | 6,3 |

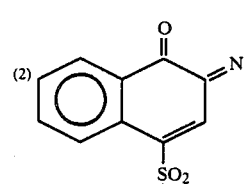

⁽¹⁾1,2 naphthoquinone diazide (2)5 sulfonyl
⁽²⁾1,2 naphthoquinone diazide (2)4 sulfonyl
⁽³⁾1,2 naphthoquinone diazide (2)4 sulfonyl and 5 sulfonyl

EXAMPLE 45

A silicon wafer was spin-coated with a coating solution comprised of

| 21.24 parts by weight | of a cresol/formaldehyde novolak (melting range 106°–115° C. according to DIN 53181), |
| 0.88 part by weight | of compound 21, |
| 0.88 part by weight | of compound 24 and |
| 77.00 parts by weight | of propylene glycol monomethyl ether-acetate, | such that a layer thickness of a 1.0 μm was obtained after drying. The resulting layer was exposed at constant exposure power for different lengths of time and then was developed in 0.530N bufferd NaOH. The energy density necessary to enable 0.5 μm of the layer to be dissolved away by the developing process was 50% lower after exposure in the mid-UV range, and 25% lower after exposure at 365–436 nm, than the energy density required for a conventional photoresist. A similar result was achieved when compound 21 in the above mixture was replaced by compound 5 and compound 24 by compound 6. The conventional photoresist had, in a 31% solution, a relative decadic absorption coefficient of 0.74. Its solids fraction was comprised of a cresol/formaldehyde novolak and suitable naphthoquinonediazide derivatives.

EXAMPLE 46

A silicon wafer was spin-coated with a coating solution comprised of

| 22.22 parts by weight | of a cresol/formaldehyde novolak (melting range 122°–132° C. according to DIN 53181), |
| 1.39 parts by weight | of compound 17, |
| 1.39 parts by weight | of compound 25 and |
| 75.00 parts by weight | of propylene glycol |

-continued

| | |
|---|---|
| | monomethyl ether-acetate, | such that a layer thickness of 1.0 μm was obtained after drying. Exposure was carried out as in Example 45; development was effected in 0.478N buffered NaOH. The energy density necessary to enable 0.5 μm of the layer to be dissolved away by the developing process was 50% lower after exposure in the mid-UV range, and 30% lower after exposure at 365–436 nm, than the energy density required for a conventional photoresist (see Example 45). Similar results were achieved when the foregoing combination of compounds 17 and 25 was replaced by corresponding mixtures of 30/31, 16/17 and 25/26, respectively, or by compounds 9, 18 or 27. The solids content of the coating solutions could then vary. The normality of the developer had to be adjusted to the particular mixture.

EXAMPLE 47

A silicon wafer was spin-coated with a coating solution comprised of

| | |
|---|---|
| 18.67 parts by weight | of a cresol/formaldehyde novolak (melting range 122°–132° C. according to DIN 53181), |
| 2.33 parts by weight | of compound 6 and |
| 79.00 parts by weight | of propylene glycol monomethyl ether-acetate, | such that a layer thickness of 1.0 μm was obtained after drying. Exposure was carried out as indicated in Example 45. Development is effected in 0.484N buffered NaOH. After exposure in the mid-UV range, the energy density necessary to enable 0.5 μm of the layer to be dissolved away by the developing process is 45% lower and, after exposure at 365–436 nm, 25% lower than the energy density required for a conventional photoresist (see Example 45). Compound 6 could be replaced by compounds 5, 16, 17, 21, 22, 25 or 26, and the developer normalities had again to be adjusted.

EXAMPLE 48

A silicon wafer was spin-coated with a coating solution comprised of

| | |
|---|---|
| 13.9 parts by weight | of poly-(pyrocatechol monomethacrylate), |
| 2.8 parts by weight | of compound 42 and |
| 83.3 parts by weight | of propylene glycol monomethyl ether-acetate, | such that a layer thickness of 1.0 μm resulted after drying. After exposure, the layer thus obtained was distinguished by good solubility in 0.36N NaOH, coupled with low solubility in the unexposed layer areas. Compound 42 could, inter alia, be replaced by compounds 5, 13, 19, 20, 23, 32 or 40, or by mixtures of naphthoquinone-4- and -5-sulfonyl derivatives such as, for example, 28/29, and the developer normalities had to be adjusted.

EXAMPLE 49

A coating solution comprised of

| | |
|---|---|
| 7.60 parts by weight | of a cresol/formaldehyde novolak (melting range 106°–115° C. according to DIN 53181), |
| 0.96 part by weight | of compound 21 and |
| 91.44 parts by weight | of a solvent mixture composed of ethylene glycol monomethyl etheracetate, butyl acetate and xylene in a weight ratio of 9:1:1 | was applied to an electrolytically roughened and anodized aluminum support, such that a layer weight of 2.34 g/m² was obtained after drying. The coated printing plate was exposed, after drying, under a positive continuous tone original, which had 13 equal density strips from 0.15 to 1.95, for 10 seconds with a 5 kW metal halide lamp at a distance of 120 cm. The exposed plate was then developed with a developer comprised of

| | |
|---|---|
| 5.3 parts by weight | of sodium metasilicate.9 H₂O |
| 3.4 parts by weight | of trisodium phosphate.12 H₂O. |
| 0.3 part by weight | of sodium dihydrogen phosphate (anhydrous) and |
| 91.0 parts by weight | of water | for 1 minute, thereby removing the exposed layer areas. The result was a print image of steep graduation with 4 wedge steps. A similar result was obtained when, in the above formulation, compound 21 was replaced by comopunds 5, 7, 10, 14, 23 or 30, respectively, or by mixtures of 14/15, 16/17 or 28/29 (in each case, 0.48 part by weight of one of the two radiation-sensitive components).

EXAMPLE 50

A solution comprising

| | |
|---|---|
| 3.9 parts by weight | of compound 40 or 42, |
| 19.5 parts by weight | of a cresol/formaldehyde novolak (melting range 106°–115° C. according to DIN 53181), |
| 6.5 parts by weight | of a polyvinyl methyl ether (having a K value of 45-55) and |
| 0.4 part by weight | of the dye Sudan Blue II (C.I. Solvent Blue 35) |
| 49.7 parts by weight | of propylene glycol monoethyl ether-acetate, |
| 10.0 parts by weight | of propylene glycol monoethyl ether and |
| 10.0 parts by weight | of butyl acetate | gave a copying resist which was vary suitable for the production of printed circuit boards. The copying resist could be applied to copper plates and to other substrates suitable for the production of printed circuit boards, inter alia, by roller coating.

What is claimed is:

1. A bis-1,2-naphthoquinone-2-diazide-sulfonic acid amide of a secondary diamine, said acid amide being represented by the formula

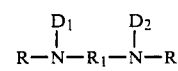

in which

R is a straight-chain or branched, unsubstituted or hydroxyl-substituted alkyl, cycloalkyl or aralkyl radical which has 1 to 14 carbon atoms and which includes a carbon chain that can be interrupted by ether oxygen atoms, $R_1$ is an alkylene radical which has 2 to 12 carbon atoms and which includes a carbon chain that can be interrupted by ether oxygen atoms, or a mononuclear or polynuclear aralkylene radical having 8 to 18 carbon atoms, or R and $R_1$ together form a mononuclear or polynuclear cycloalkyl radical having 4 to 16 carbon atoms, and $D_1$ and $D_2$ are identical or different and are 1,2-naphthoquinone-2-diazide-4- or -5-sulfonyl radicals.

2. A bis-1,2-naphthoquinone-2-diazide-sulfonic acid amide as claimed in claim 1, wherein $R_1$ is a polynuclear aralkylene radical comprised of aromatic members that are linked by a single bond, by —O—, —S—, —$SO_2$—, —CO— or —$CR_2R_3$—, —N[$C_{1-3}$—alkyl]CO— or a $C_{2-5}$—alkyl group which can be interrupted by ether oxygen atoms, $R_2$ and $R_3$ can be identical or different, and are separately hydrogen or an alkyl radical which is unsubstituted or substituted and which has 1 or 2 carbon atoms.

3. A bis-1,2-naphthoquinone-2-diazide-sulfonic acid amide as claimed in claim 1, wherein R and $R_1$ together form a polynuclear cycloalkyl radical comprised of cycloaliphatic moieties that are linked by a carbon chain having 1 to 6 carbon atoms.

4. A bis-1,2-naphthoquinone-2-diazide-sulfonic acid amide as claimed in claim 1, wherein R is straight-chain or branched, unsubstituted or hydroxyl-substituted alkyl or cycloalkyl radical which has 1 to 8 carbon atoms and which includes a carbon chain that can be interrupted by ether oxygen atoms, or an aralkyl radical having 7 to 14 carbon atoms, and $R_1$ is an alkylene radical which has 2 to 10 carbon atoms and the carbon chain that can be interrupted by ether oxygen atoms, or a mononuclear or polynuclear aralkylene radical having 8 to 14 carbon atoms.

5. A bis-1,2-naphthoquinone-2-diazide-sulfonic acid amide as claimed in claim 4, wherein $R_1$ is a polynuclear aralkylene radical comprised of aromatic members that are linked by a single bond, by —O—, —S—, —$SO_2$—, —CO— or —$CR_2R_3$—, —N[$C_{1-2}$—alkyl]CO— or a $C_{2-5}$—alkyl group which can be interrupted by ether oxygen atoms.

6. A bis-1,2-naphthoquinone-2-diazide-sulfonic acid amide as claimed in claim 1, wherein R has 1 to 4 carbon atoms.

7. A radiation-sensitive mixture comprising a bis-1,2-naphthoquinone-2-diazide-sulfonic acid amide as claimed in claim 1, said acid amide being present in an amount sufficient to impart radiation-sensitivity to said mixture.

8. A radiation-sensitive mixture as claimed in claim 7, wherein said acid amide is a 4- or 5-sulfonyl derivative.

9. A radiation-sensitive mixture as claimed in claim 7, wherein said mixture comprises (i) a mixture of said 4- and 5-sulfonyl derivatives or (ii) said acid amide which is a mixed 4,5-sulfonyl derivative.

10. A radiation-sensitive mixture as claimed in claim 9, said mixture comprising a mixture of said 4- and 5-sulfonyl derivatives.

11. A radiation-sensitive mixture as claimed in claim 7, further comprising a polymeric resinous binder which is insoluble in water and soluble or swellable in aqueous-alkaline solution.

12. A radiation-sensitive mixture as claimed in claim 11, wherein said acid amide is present in an amount ranging between about 4 and about 40%, relative to the solids content of said mixture.

13. A radiation-sensitive copying material comprised of a support and a radiation-sensitive layer provided on said support, said layer comprising (A) a polymeric resinous binder which is insoluble in water and soluble or swellable in aqueous-alkaline solutions and (B) a bis-1,2-naphthoquinone-2-diazide-sulfonic acid amide as claimed in claim 1.

* * * * *